(12) United States Patent
Fujihara et al.

(10) Patent No.: US 11,609,373 B2
(45) Date of Patent: *Mar. 21, 2023

(54) OPTICAL COUPLING DEVICE

(71) Applicants: Kabushiki Kaisha Toshiba, Tokyo (JP); Toshiba Electronic Devices & Storage Corporation, Tokyo (JP)

(72) Inventors: Mami Fujihara, Nakatsu Oita (JP); Naoya Takai, Yukuhashi Fukuoka (JP); Kazuki Tanaka, Kitakyushu Fukuoka (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 90 days.

This patent is subject to a terminal disclaimer.

(21) Appl. No.: 17/015,350

(22) Filed: Sep. 9, 2020

(65) Prior Publication Data

US 2021/0247567 A1 Aug. 12, 2021

(30) Foreign Application Priority Data

Feb. 10, 2020 (JP) .............................. JP2020-020494

(51) Int. Cl.
*H01L 31/02* (2006.01)
*G02B 6/12* (2006.01)
(Continued)

(52) U.S. Cl.
CPC ..... *G02B 6/12007* (2013.01); *G02B 6/12004* (2013.01); *G02F 1/3132* (2013.01); *H01L 31/0224* (2013.01); *H01L 31/02327* (2013.01)

(58) Field of Classification Search
CPC ........... H01L 31/14–173; H01L 31/153; H01L 25/167; H01L 31/0224; H01L 31/02327
See application file for complete search history.

(56) References Cited

U.S. PATENT DOCUMENTS

| 8,816,310 B2 | 8/2014 | Hoshino et al. |
| 2007/0187629 A1 | 8/2007 | Matsuyama |

(Continued)

FOREIGN PATENT DOCUMENTS

| JP | 2007-165621 A | 6/2007 |
| JP | 2008-117962 A | 5/2008 |

(Continued)

*Primary Examiner* — Suberr L Chi
(74) *Attorney, Agent, or Firm* — Allen & Overy LLP

(57) ABSTRACT

An optical coupling device includes a light receiving element including a first output terminal and a second output terminal, a light emitting element provided on the light receiving element, a first switching element, a first electrode plate, and a sealing member. The first switching element includes a first main terminal connected to the first output terminal, a first control terminal connected to the second output terminal, and a second main terminal. An upper surface of the first electrode plate is connected to the second main terminal. The sealing member covers the light receiving element, the light emitting element, and the first switching element. A lower surface of the first electrode plate is exposed on a lower surface of the sealing member. The lower surface of the first electrode plate and the lower surface of the sealing member form the same plane.

9 Claims, 8 Drawing Sheets

(51) Int. Cl.
*G02F 1/313* (2006.01)
*H01L 31/0232* (2014.01)
*H01L 31/0224* (2006.01)

(56) References Cited

U.S. PATENT DOCUMENTS

| | | |
|---|---|---|
| 2015/0262985 A1 | 9/2015 | Takai et al. |
| 2015/0303180 A1 | 10/2015 | Noguchi et al. |
| 2017/0069610 A1* | 3/2017 | Takai .................... H01L 23/373 |
| 2017/0176519 A1* | 6/2017 | Takai ..................... H01L 22/34 |
| 2021/0125973 A1* | 4/2021 | Kao ........................ H01L 24/06 |
| 2021/0249391 A1* | 8/2021 | Fujihara ................ H01L 25/167 |

FOREIGN PATENT DOCUMENTS

| | | |
|---|---|---|
| JP | 5502422 B2 | 5/2014 |
| JP | 2015-050281 A | 3/2015 |
| JP | 2015-177056 A | 10/2015 |
| JP | 2018-186292 A | 11/2018 |

\* cited by examiner

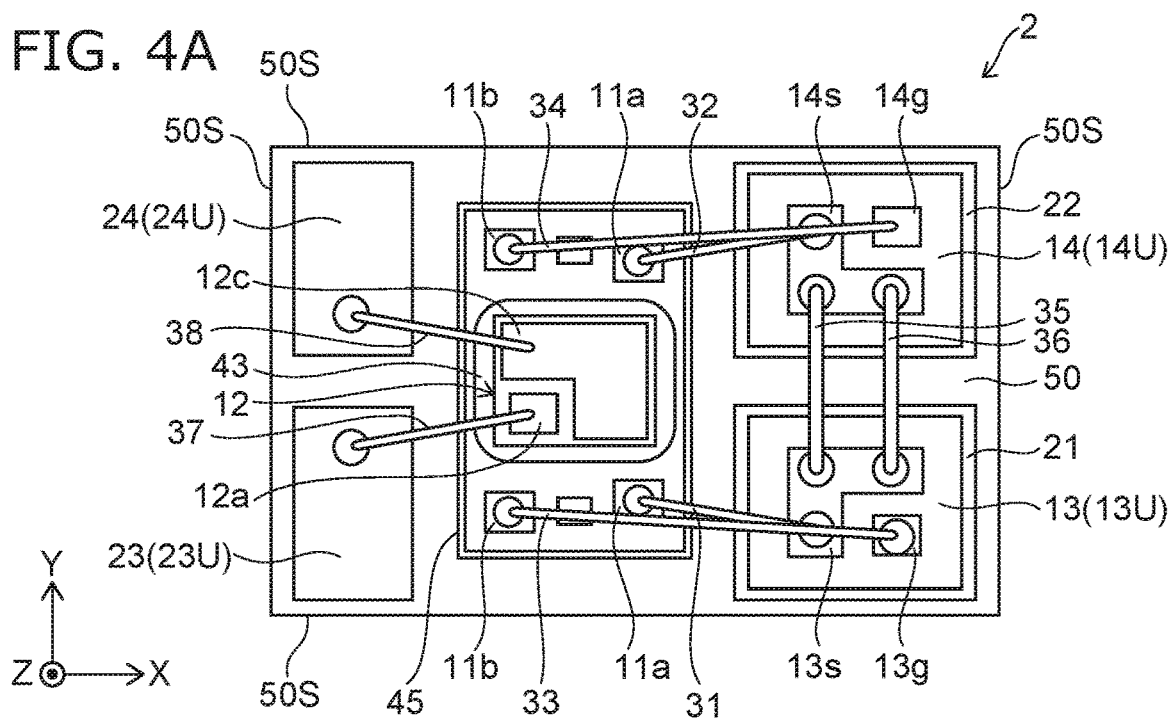
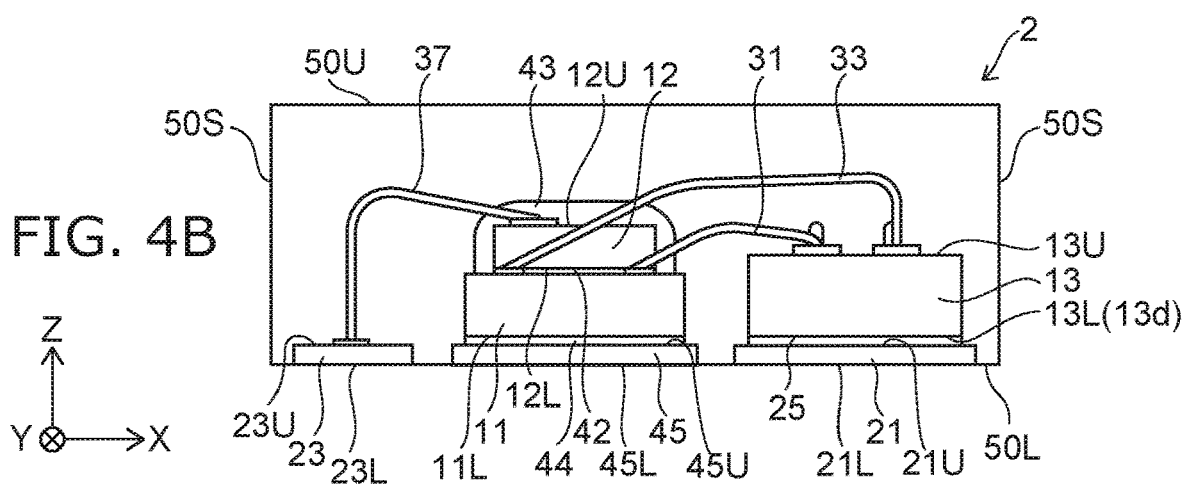
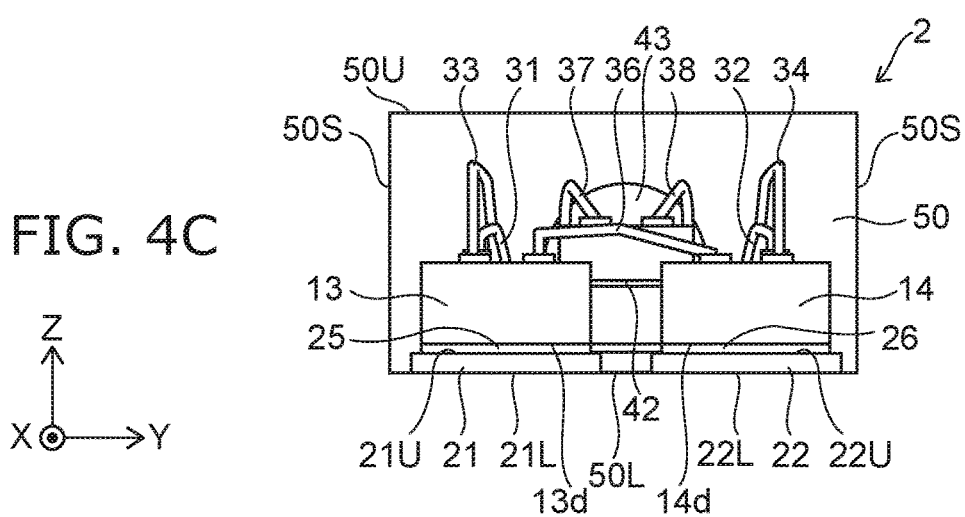

OPTICAL COUPLING DEVICE

CROSS-REFERENCE TO RELATED APPLICATIONS

This application is based upon and claims the benefit of priority from Japanese Patent Application No. 2020-020494, filed on Feb. 10, 2020; the entire contents of which are incorporated herein by reference.

FIELD

Embodiments described herein relate generally to an optical coupling device.

BACKGROUND

Conventionally, an optical coupling device that controls a high frequency current by inputting a control signal to a switching element via a light emitting element and a light receiving element has been used. The optical coupling device is required to have good high frequency current transmission characteristics.

BRIEF DESCRIPTION OF THE DRAWINGS

FIGS. 4A to 4C are three-directional views showing an optical coupling device according to a second embodiment;

DETAILED DESCRIPTION

According to one embodiment, an optical coupling device includes a light receiving element including a first output terminal and a second output terminal, a light emitting element provided on the light receiving element, a first switching element, a first electrode plate, and a sealing member. The first switching element includes a first main terminal connected to the first output terminal, a first control terminal connected to the second output terminal, and a second main terminal. An upper surface of the first electrode plate is connected to the second main terminal. The sealing member covers the light receiving element, the light emitting element, and the first switching element, A lower surface of the first electrode plate is exposed on a lower surface of the sealing member. The lower surface of the first electrode plate and the lower surface of the sealing member form the same plane.

First Embodiment

First of all, a first embodiment will be described.

Figure 1:
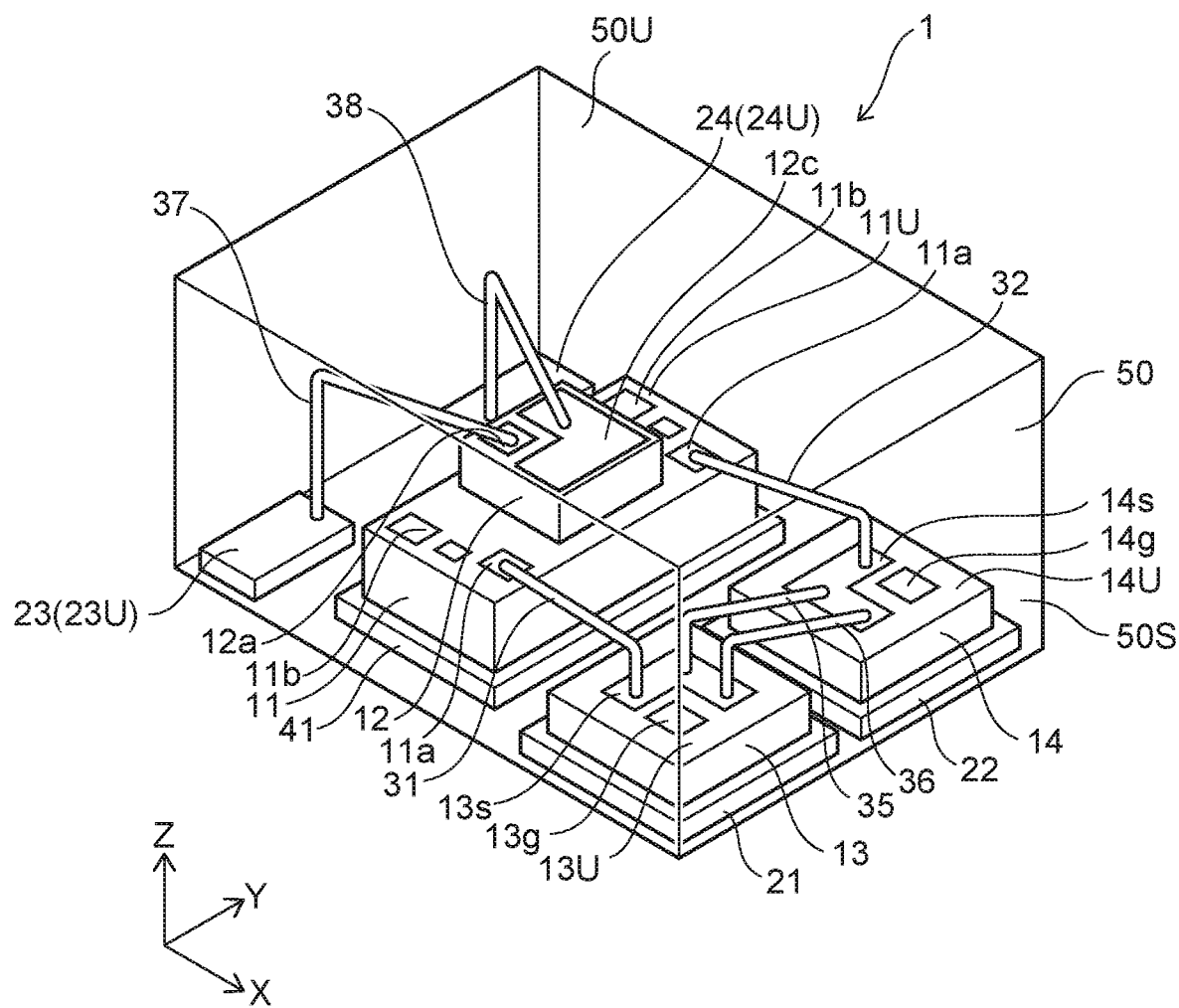
FIG. 1 is a perspective view showing an optical coupling device according to a first embodiment.

FIG. 1 is a perspective view showing an optical coupling device according to the embodiment.

Figure 2A:
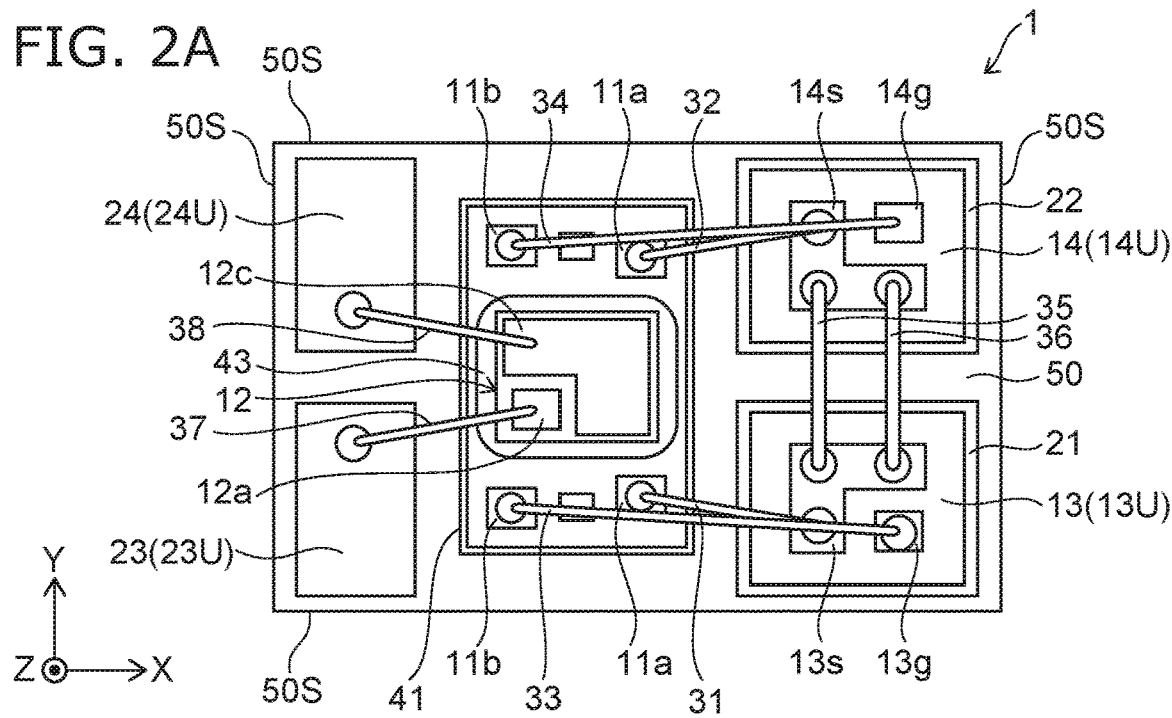
FIGS. 2A to 2C are three-directional views showing the optical coupling device according to the first embodiment.
Figure 2B:
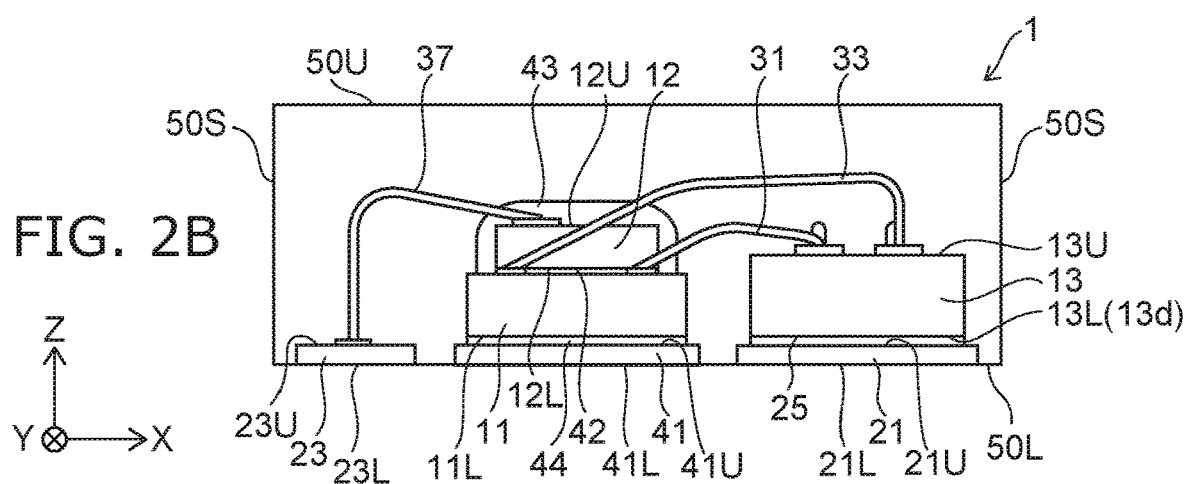
Figure 2C:
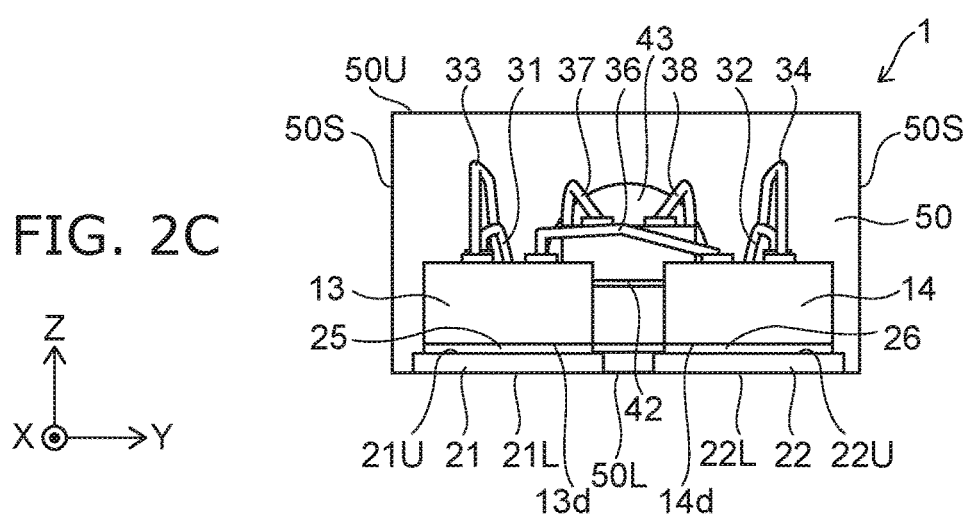

FIGS. 2A to 2C are three-directional views showing the optical coupling device according to the embodiment.

Figure 3:
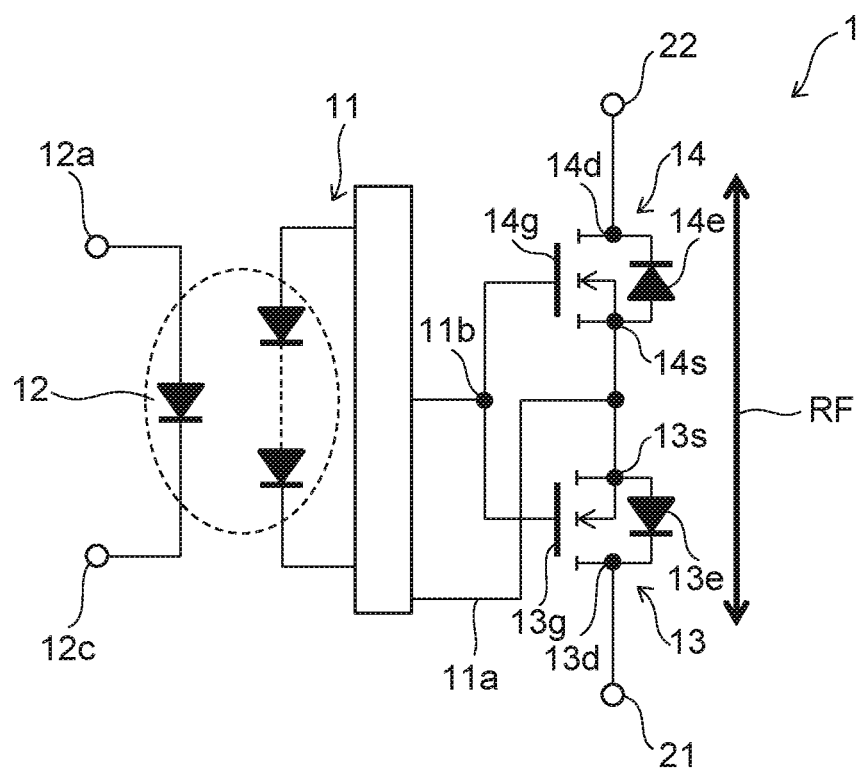
FIG. 3 is a circuit diagram showing the optical coupling device according to the first embodiment.

FIG. 3 is a circuit diagram showing the optical coupling device according to the embodiment.

The optical coupling device according to the embodiment is, for example, a photo relay.

As shown in FIG. 1 to FIG. 3, in the optical coupling device 1 according to the embodiment, a light receiving element 11, a light emitting element 12, a MOSFET 13, and a MOSFET 14 are provided as functional elements. The MOSFETs 13 and 14 are vertical metal-oxide semiconductor field effect transistors. Further, the optical coupling device 1 is provided with electrode plates 21 to 24, connection layers 25 and 26, and wires 31 to 38 as connection members. Further, the optical coupling device 1 is provided with a metal plate 41, an adhesive layer 42, a light transmitting member 43, an adhesive layer 44, and a sealing member 50 as structural members. Note that, in order to make the drawing easy to see, the wires 33 and 34, the light transmitting member 43, the connection layers 25 and 26, and the adhesive layers 42 and 44 are omitted.

The light receiving element 11 is an element that outputs an electric signal according to incident light, and is, for example, a photodiode array. Further, an upper surface 11U is provided with a pair of output terminals 11a and a pair of output terminals 11b. When light is incident on the light receiving element 11, a voltage is generated between the output terminal 11a and the output terminal 11b. No terminals are provided on a lower surface 11L of the light receiving element 11. The light receiving element 11 is provided on the metal plate 41. The lower surface 11L of the light receiving element 11 is bonded to an upper surface 41U of the metal plate 41, for example, via the adhesive layer 44. The shape of the metal plate 41 is, for example, a rectangular plate shape. The adhesive layer 44 is, for example, insulative.

The light emitting element 12 is an element that emits light when power is input, and is, for example, an LED (Light Emitting Diode). The light emitting element 12 is provided on the light receiving element 11 via the adhesive layer 42. The adhesive layer 42 is a layer in which the adhesive is solidified, and is made of, for example, a transparent resin such as silicone etc. An anode terminal 12a and a cathode terminal 12c are provided on an upper surface 12U of the light emitting element 12. A region around the region where the light emitting element 12 is mounted on the upper surface 11U of the light receiving element 11 and the entire light emitting element 12 are covered with the light transmitting member 43. On the other hand, the region of the upper surface 11U of the light receiving element 11 where the pair of output terminals 11a and the pair of output terminals 11b are provided is not covered with the light transmitting member 43. The light transmitting member 43 is made of a transparent resin such as silicone and has a substantially dome shape.

The MOSFETs 13 and 14 are switching elements that control the current flowing between the first main terminal and the second main terminal based on the control voltage input to the control terminal. The MOSFETs 13 and 14 are disposed side by side on the light receiving element 11. The MOSFET 13 is provided on the electrode plate 21 via the connection layer 25, and the MOSFET 14 is provided on the electrode plate 22 via the connection layer 26. The connection layers 25 and 26 are formed of a conductive material such as solder or silver paste.

Hereinafter, in the specification, an XYZ orthogonal coordinate system is adopted for convenience of illustration. The upward direction, that is, a direction from the light receiving element 11 to the light emitting element 12 is a "Z direction", a direction in which the MOSFETs 13 and 14 are located from the light receiving element 11 is a "X direction", and a direction from the MOSFET 13 to the MOSFET 14 is a "Y direction". A straight line connecting the light receiving element 11 and the MOSFET 13 at the shortest distance extends in the X direction, and a straight line connecting the MOSFET 13 and the MOSFET 14 at the shortest distance extends in the Y direction. Further, if necessary, the Z direction is also referred to as "+Z direction", and the direction reverse to the +Z direction, that is, the downward direction is also referred to as "−Z direction". The same applies to the X direction and the Y direction.

An upper surface 13U of the MOSFET 13 is provided with a source terminal 13s as a first main terminal and a gate terminal 13g as a control terminal. A drain terminal 13d as a second main terminal is provided on a lower surface 13L of the MOSFET 13. The drain terminal 13d is connected to an upper surface 21U of the electrode plate 21 via the connection layer 25. Similarly, a source terminal 14s and a gate terminal 14g are provided on an upper surface 14U of the MOSFET 14. A drain terminal 14d is provided on a lower surface 14L of the MOSFET 14. The drain terminal 14d is connected to an upper surface 22U of the electrode plate 22 via the connection layer 26.

In the MOSFET 13, a diode 13e that allows a current to flow from the source terminal 13s toward the drain terminal 13d is provided. Similarly, in the MOSFET 14, a diode 14e that allows a current to flow from the source terminal 14s toward the drain terminal 14d is provided.

The source terminal 13s of the MOSFET 13 is connected to one output terminal 11a of the light receiving element 11 via the wire 31. The source terminal 14s of the MOSFET 14 is connected to the other output terminal 11a of the light receiving element 11 via the wire 32. Therefore, the same potential is applied to the source terminals 13s and 14s from the pair of output terminals 11a. Note that only one output terminal 11a of the light receiving element 11 is provided, and the wire 31 and the wire 32 may be connected to this one output terminal 11a. In this case, both the source terminal 13s of the MOSFET 13 and the source terminal 14s of the MOSFET 14 are connected to one output terminal 11a.

The gate terminal 13g of the MOSFET 13 is connected to one output terminal 11b of the light receiving element 11 via the wire 33. The gate terminal 14g of the MOSFET 14 is connected to the other output terminal 11b of the light receiving element 11 via the wire 34. Therefore, the same potential is applied to the gate terminals 13g and 14g from the pair of output terminals 11b. Only one output terminal 11b of the light receiving element 11 is provided, and the wire 33 and the wire 34 may be connected to this one output terminal 11b. In this case, both the gate terminal 13g of the MOSFET 13 and the gate terminal 14g of the MOSFET 14 are connected to one output terminal 11b.

The wires 35 and 36 connect the source terminal 13s of the MOSFET 13 to the source terminal 14s of the MOSFET 14. One end of the wire 35 is connected to the source terminal 13s, the other end is connected to the source terminal 14s, and the portions other than both ends are positioned above the MOSFETs 13 and 14. The same applies to the wire 36. That is, the wires 35 and 36 straddle the gap between the MOSFET 13 and the MOSFET 14 above the MOSFETs 13 and 14 (on the Z direction side). Viewed from above, for example, the wires 35 and 36 extend in the Y direction. Preferably, the wires 35 and 36 are parallel to each other, at least when viewed from above. More preferably, the three-dimensional shape of the wires 35 and 36 is a mirror image with respect to the YZ plane, or is left-right inverted symmetric when viewed from the X direction. Note that the wires 35 and 36 do not have to be parallel to each other, mirror images, or left-right inverted symmetry.

The wires 35 and 36 connect the source terminal 13s and the source terminal 14s at the shortest distance within the allowable range of the wire bonding conditions, and the length thereof is about 0.5 mm. The distance between the electrode plate 21 and the electrode plate 22 is preferably made as short as possible within the range that does not hinder the assembly, but is preferably 0.3 mm or more in order to maintain the withstand voltage. The length of the wires 35 and 36 is, for example, 1 mm or less. The diameter of the wires 35 and 36 is preferably 38 μm or more. When the source terminal 13s and the source terminal 14s are connected by three or more wires, the diameter of each wire is preferably 28 μm or more. This is because when connecting with three or more wires, it becomes easier to secure the total cross-sectional area as compared with when connecting with two wires, but it is difficult to secure the distance between the wires.

The electrode plates 23 and 24 are disposed in the −X direction when viewed from the metal plate 41. The electrode plate 23 and the electrode plate 24 are arranged along the Y direction. Therefore, the metal plate 41 is disposed between the electrode plate 21 and the electrode plate 23, and between the electrode plate 22 and the electrode plate 24. The distance between the electrode plate 21 and the metal plate 41 is, for example, 0.5 mm or more, and the distance between the electrode plate 22 and the metal plate 41 is, for example, 0.5 mm or more. An upper surface 23U of the electrode plate 23 is connected to the anode terminal 12a of the light emitting element 12 via the wire 37. An upper surface 24U of the electrode plate 24 is connected to the cathode terminal 12c of the light emitting element 12 via the wire 38.

The electrode plates 21 to 24 function as external electrodes of the optical coupling device 1. On the other hand, the metal plate 41 has no electrical function and is, for example, electrically floated. The metal plate 41 supports the light receiving element 11 in the manufacturing process of the optical coupling device 1. The electrode plates 21 to 24 and the metal plate 41 are different portions of the same lead frame in the manufacturing process of the optical coupling device 1. Therefore, the electrode plates 21 to 24 and the metal plate 41 have substantially the same position, thickness, and composition in the Z direction.

Each of the electrode plates 21 to 24 and the metal plate 41 has a rectangular plate shape. When viewed from the Z direction, the electrode plate 21 is one size larger than the MOSFET 13, the electrode plate 22 is one size larger than the MOSFET 14, and the metal plate 41 is one size larger than the light receiving element 11. The length of the side surfaces of the electrode plates 21 and 22 facing each other in the X direction is, for example, 1 mm or less. In the electrode plates 21 to 24 and the metal plate 41, for example, a main body made of nickel is plated with gold. The thickness of the electrode plates 21 to 24 and the metal plate 41 is, for example, 0.1 mm or less. The electrode plates 21 to 24 and the metal plate 41 may be a single-layer plate, a stacked plate in which two or more metal layers are stacked, or may partially include an insulating layer. Further, the shape may be such that the upper portion is one size larger than the lower portion. The wires 31 to 38 are made of, for example, gold having a low resistivity or an alloy such as a gold alloy, and preferably have a lower impedance than a single wire connection with respect to a transmitted high frequency signal.

The sealing member 50 covers the light receiving element 11, the light emitting element 12, the MOSFETs 13 and 14, the electrode plates 21 to 24, the connection layers 25 and 26, the wires 31 to 38, the metal plate 41, the adhesive layers 42 and 44, and the light transmitting member 43. The sealing member 50 is made of a black resin material, for example, an epoxy resin. The outer shape of the sealing member 50 is, for example, a rectangular parallelepiped. A lower surface 21L of the electrode plate 21, a lower surface 22L of the electrode plate 22, a lower surface 23L of the electrode plate 23, a lower surface 24L of the electrode plate 24, and a lower surface 41L of the metal plate 41 are exposed on a lower surface 50L of the sealing member 50. The lower surface 50L of the sealing member 50, the lower surface 21L of the electrode plate 21, the lower surface 22L of the electrode plate 22, the lower surface 23L of the electrode plate 23, the lower surface 24L of the electrode plate 24, and the lower surface 41L of the metal plate 41 form the same plane. Further, metal members such as electrode plates are not exposed on an upper surface 50U and four side surfaces 50S of the sealing member 50. The length in the X direction of the optical coupling device 1 is, for example, 2.00 mm, the length in the Y direction is 1.45 mm, and the length in the Z direction is, for example, 1.0 mm.

Next, the operation of the optical coupling device 1 according to the embodiment will be described.

The electrode plates 21 to 24 are connected to the outside via a bonding member (not shown) such as solder. A high frequency current RF is applied between the electrode plate 21 and the electrode plate 22. The frequency of the high frequency current RF is, for example, 10 GHz or higher, for example, about 20 to 24 GHz. When the MOSFETs 13 and 14 are off, the high frequency current RF does not substantially pass through the optical coupling device 1.

When a predetermined direct current voltage is applied between the electrode plate 23 and the electrode plate 24, a direct current voltage is applied between the anode terminal 12a and the cathode terminal 12c of the light emitting element 12 via the wires 37 and 38, and the light emitting element 12 emits light. The light emitted from the light emitting element 12 enters the light receiving element 11 via the adhesive layer 42 or the light transmitting member 43. As a result, a voltage is generated between the output terminal 11a and the output terminal 1ib of the light receiving element 11.

The voltage output from the light receiving element 11 is applied between the source terminal 13s and the gate terminal 13g of the MOSFET 13 via the wires 31 and 33, and the MOSFET 13 is turned on. Similarly, the voltage output from the light receiving element 11 is applied between the source terminal 14s and the gate terminal 14g of the MOSFET 14 via the wires 32 and 34, and the MOSFET 14 is turned on. As a result, the high frequency current RF flows between the electrode plates 21 and 22 via the MOSFETs 13 and 14. That is, the high frequency current RF flows through a current path formed by the electrode plate 21, the connection layer 25, the MOSFET 13, the wires 35 and 36, the MOSFET 14, the connection layer 26, and the electrode plate 22, which connects the respective bonding points at a substantially shortest distance. In this way, the high frequency current RF is controlled.

Next, the effects of the embodiment will be described.

In the optical coupling device 1, the electrode plate 21 is a single thin plate, a bonding member such as solder is bonded to the lower surface 21L, and the drain terminal 13d of the MOSFET 13 is bonded to the upper surface 21U. Therefore, the inductance component of the electrode plate 21 is small, and the loss of the high frequency current RF in the electrode plate 21 is small. Similarly, since the electrode plate 22 is also a single thin plate, the high frequency current RF loss in the electrode plate 22 is small. As a result, the optical coupling device 1 has good high frequency current transmission characteristics.

Further, in the optical coupling device 1, the source terminal 13s and the source terminal 14s are connected each other via the two wires 35 and 36. Therefore, the inductance component between the source terminal 13s and the source terminal 14s is small, and the loss of the high frequency current RF is small. It should be noted that it is conceivable to provide one thick wire instead of the wires 35 and 36. However the high frequency current RF concentrates near the surface of the wire due to the skin effect. Therefore, if the total cross sectional area is the same, the loss is smaller when many thin wires are provided.

Further, when the frequency of the high frequency current becomes about 20 GHz, the high frequency current becomes straight. Therefore, if the wires 35 and 36 have portions extending in the X direction, the high frequency current RF is oscillated in the X direction, and leaks easily occur. In the optical coupling device 1, the wires 35 and 36 are parallel to each other, pass through the Z-direction sides of the MOSFETs 13 and 14, extend in the Y-direction, and do not substantially extend in the X-direction. Therefore, the oscillation of the high frequency current RF in the X direction can be suppressed. This can also improve the transmission characteristics of the high frequency current.

Furthermore, in the optical coupling device 1, the metal member is not exposed on the side surface 50S of the sealing member 50. Therefore, in the process of manufacturing the optical coupling device 1, when the sealing member 50 is diced, no metal member is present on the dicing surface. Therefore, it is possible to accurately dice the sealing member 50 and suppress wear of the dicing blade. Moreover, the sealing member 50 and the metal member are not peeled off from each other on the dicing surface.

Second Embodiment

FIGS. 4A to 4C are three-directional views showing an optical coupling device according to the embodiment.

As shown in FIGS. 4A to 4C, the optical coupling device 2 according to the embodiment is different from the optical coupling device 1 according to the first embodiment (see FIG. 1 to FIG. 3) in that an insulating film 45 is provided instead of the metal plate 41. An upper surface 45U of the insulating film 45 is bonded to the lower surface 11L of the light receiving element 11, and a lower surface 45L of the insulating film 45 is exposed at the lower surface 50L of the sealing member 50. The insulating film 45 is slightly larger than the light receiving element 11 when viewed from the Z direction. The insulating film 45 may function as an insulating fixing material for fixing the light receiving element 11 to an external mounting board (not shown). The insulating film 45 is, for example, DAF (Die Attach Film) or DBF (Die Bonding Film), and is made of, for example, a material obtained by adding inorganic particles such as silica to a mixture of epoxy resin, acrylic polymer, polyimide and the like.

In the optical coupling device 2 according to the embodiment, since the insulating film 45 is provided below the light receiving element 11, the parasitic capacitance between the mounting board and the light receiving element 11 can be reduced. Further, since the metal plate 41 does not exist, the high frequency current RF does not leak from the electrode plates 21 and 22 to the mounting board via the metal plate 41. Further, it is possible to suppress the fluctuation of the transmission characteristics due to the fluctuation of the distance between the metal plate 41 and the electrode plates 21 and 22. As described above, according to the embodiment, it is possible to further improve the transmission characteristics of the high frequency current. The configuration, operation, and effect of the embodiment other than those described above are the same as those of the first embodiment.

Third Embodiment

Next, a third embodiment will be described.

Figure 5A:
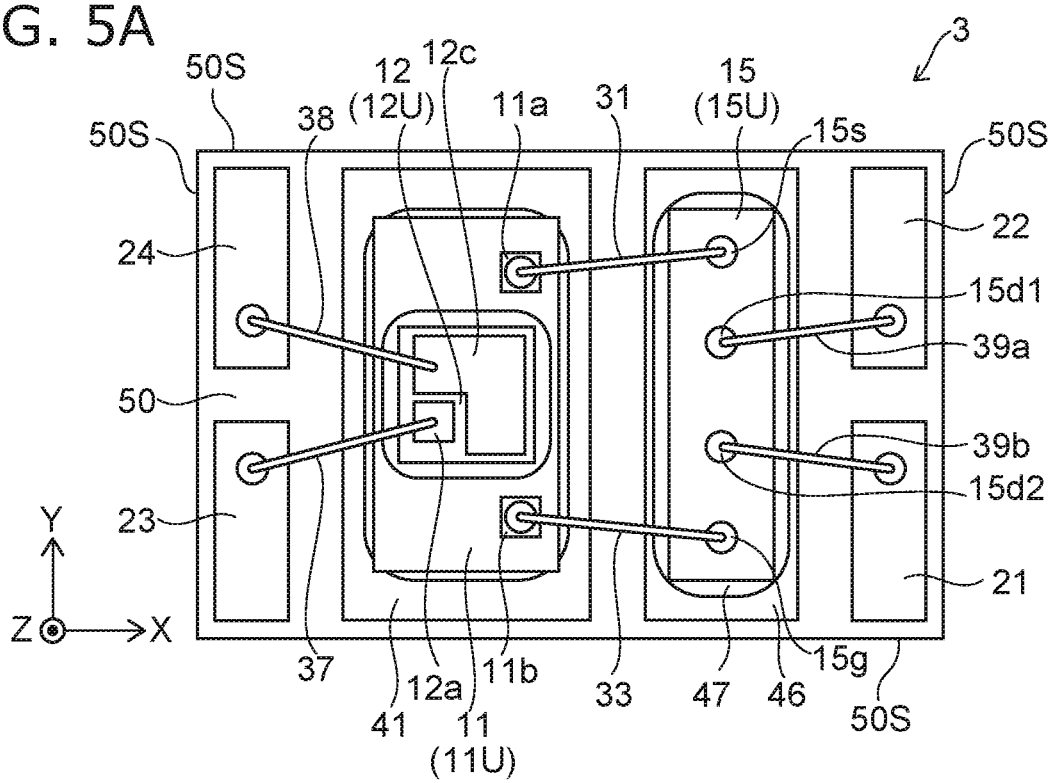
FIGS. 5A to 5C are three-directional views showing an optical coupling device according to a third embodiment.
Figure 5B:
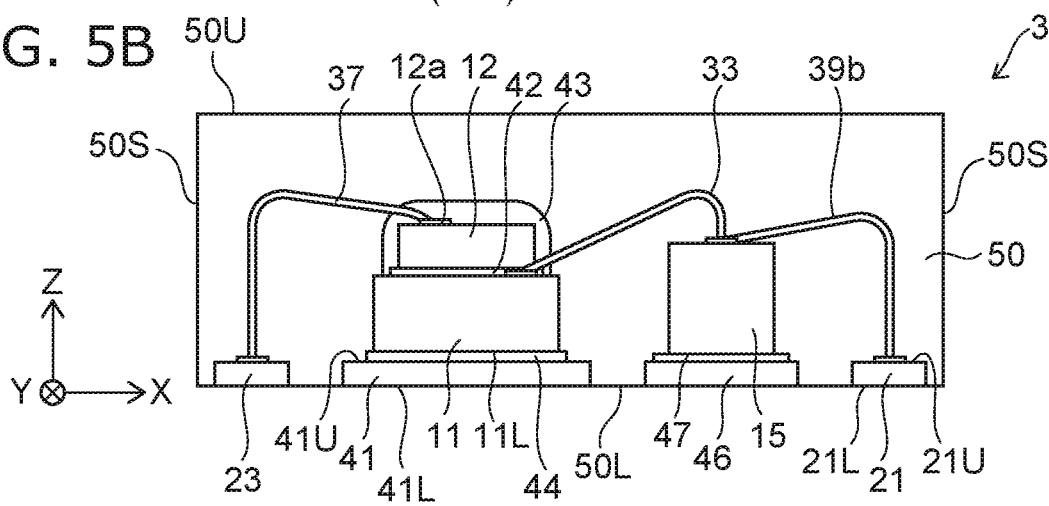
Figure 5C:
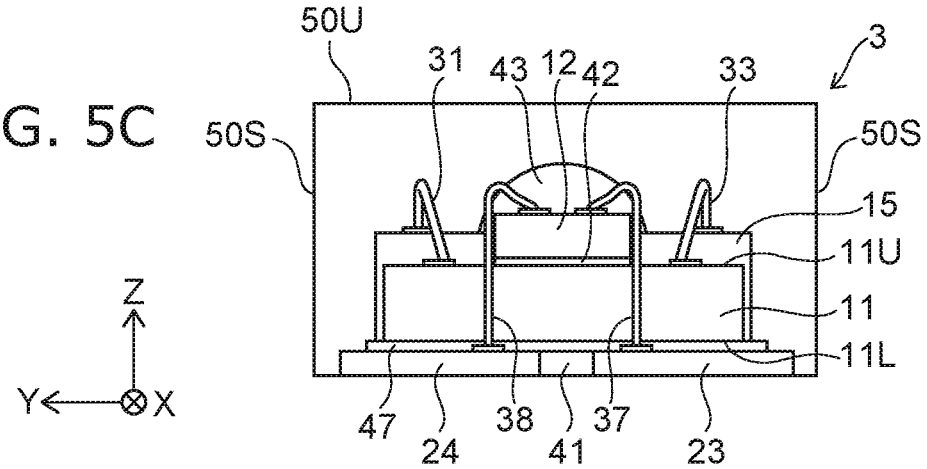

FIGS. 5A to 5C are three-directional views showing an optical coupling device according to the embodiment.

As shown in FIGS. 5A to 5C, in the optical coupling device 3 according to the embodiment, a horizontal MOSFET 15 is provided as a switching element instead of the vertical MOSFETs 13 and 14. Further, in the optical coupling device 3, the metal plate 46 is provided, and the MOSFET 15 is disposed on the metal plate 46. That is, an upper surface 46U of the metal plate 46 is bonded to a lower surface 15L of the MOSFET 15 via an adhesive layer 47, and a lower surface 46L of the metal plate 46 is exposed at the lower surface 50L of the sealing member 50. The lower surface 46L of the metal plate 46 and the lower surface 50L of the sealing member 50 form the same plane.

A source terminal 15s, two drain terminals 15d1 and 15d2, and one gate terminal 15g are provided on the upper surface 15U of the MOSFET 15. No terminal is provided on the lower surface 15L of the MOSFET 15. The equivalent circuit of MOSFET 15 is similar to the equivalent circuit of MOSFETs 13 and 14 shown in FIG. 3. That is, in the MOSFET 15, two transistors including a diode are connected in series. The drain of each transistor is separated, the source of each transistor is common, and the gate of each transistor is also common.

Further, one output terminal 11a and one output terminal 11b are provided on the upper surface 11U of the light receiving element 11. The source terminal 15s of the MOSFET 15 is connected to the output terminal 11a of the light receiving element 11 via the wire 31. The gate terminal 15g is connected to the output terminal 11b of the light receiving element 11 via the wire 33. The drain terminal 15d1 is connected to the electrode plate 22 via a wire 39a. The drain terminal 15d2 is connected to the electrode plate 21 via a wire 39b.

The electrode plate 23, the metal plate 41, the metal plate 46, and the electrode plate 21 are arranged in this order along the X direction, and the electrode plate 24, the metal plate 41, the metal plate 46, and the electrode plate 22 are arranged in this order along the X direction. The upper and lower surfaces of the electrode plates 21 to 24 and the metal plates 41 and 46 may be plated with gold, and the side surfaces thereof may be plated with silver. Portions of the electrode plates 21 to 24 and the metal plates 41 and 46 have the same thickness, and their side faces are plated with silver to improve the adhesion with the sealing member 50.

According to the embodiment, by using the lateral MOSFET 15 as the switching element, the parasitic capacitance between the source and drain of the MOSFET 15 can be reduced. The configuration, operation, and effect of the embodiment other than those described above are the same as those of the first embodiment.

Note that, also in the embodiment, the insulating film 45 may be provided instead of the metal plate 41, as in the second embodiment. Thereby, the parasitic capacitance between the light receiving element 11 and the mounting board can be reduced. An insulating film may be provided instead of the metal plate 46. As a result, the parasitic capacitance between the MOSFET 15 and the mounting board can be reduced. As a result, the transmission characteristics of the high frequency current are improved.

Fourth Embodiment

Next, a fourth embodiment will be described.

Figure 6A:
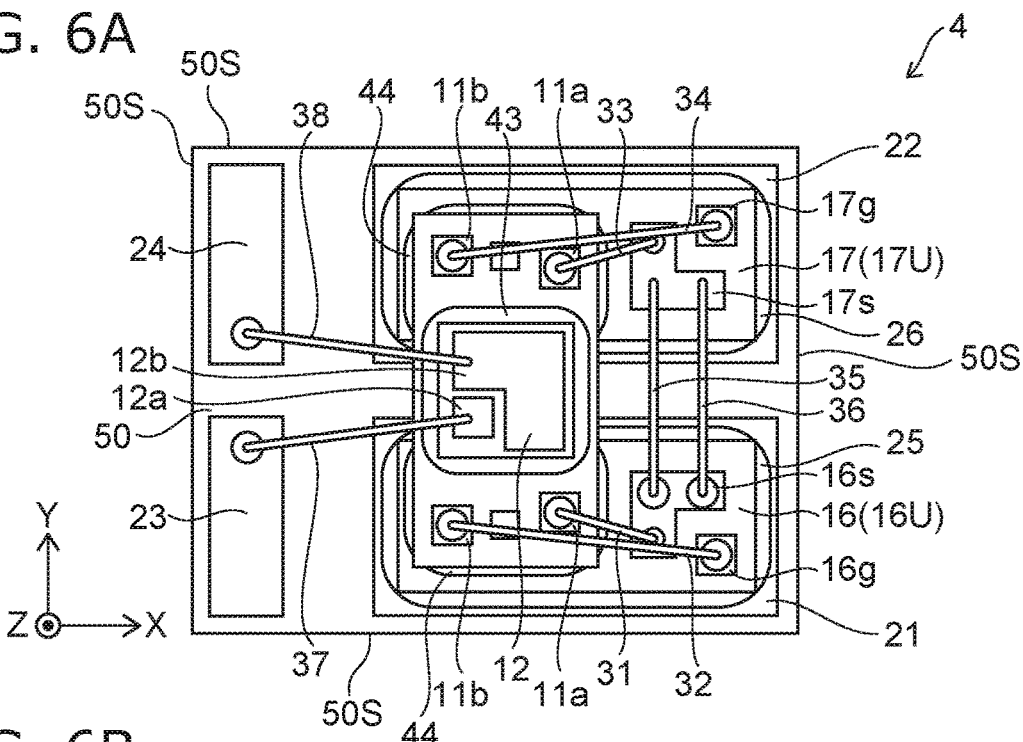
FIGS. 6A to 6C are three-directional views showing an optical coupling device according to a fourth embodiment.
Figure 6B:
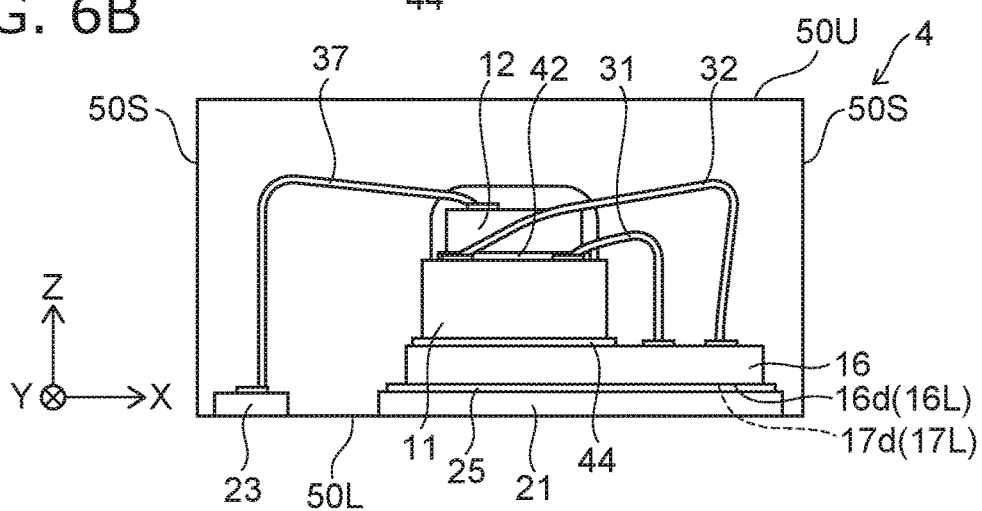
Figure 6C:
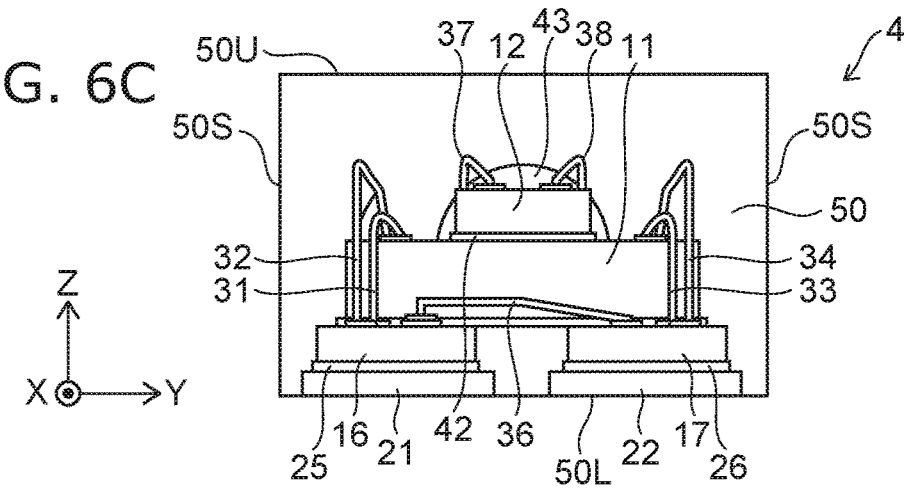

FIGS. 6A to 6C are three-directional views showing an optical coupling device according to the embodiment.

As shown in FIGS. 6A to 6C, the optical coupling device 4 according to the embodiment has a three-layered structure including the MOSFET, the light receiving element 11, and the light emitting element 12 stacked along the Z-direction. The details will be described below.

In the optical coupling device 4, vertical MOSFETs 16 and 17 are provided as switching elements instead of the vertical MOSFETs 13 and 14, respectively. The lengths of the MOSFETs 16 and 17 in the X direction are longer than the lengths of the MOSFETs 13 and 14 in the X direction.

A source terminal 16s and a gate terminal 16g of the MOSFET 16 are disposed in a region on the +X direction side of an upper surface 16U of the MOSFET 16. A drain terminal 16d of the MOSFET 16 is provided on a lower surface 16L of the MOSFET 16 and is connected to the electrode plate 21 via the connection layer 25. Similarly, a source terminal 17s and a gate terminal 17g of the MOSFET 17 are disposed in the region on the +X direction side of an upper surface 17U of the MOSFET 17. A drain terminal 17d of the MOSFET 17 is provided on a lower surface 17L of the MOSFET 17 and is connected to the electrode plate 22 via the connection layer 26.

The light receiving element 11 is disposed on the −X direction side portion of the MOSFET 16 and on the −X direction side portion of the MOSFET 17. Therefore, in the optical coupling device 4, the MOSFETs 16 and 17, the light receiving element 11, and the light emitting element 12 are arranged in this order along the +Z direction.

In the embodiment, the light receiving element 11 is disposed on the MOSFET 16 and the MOSFET 17, and the light emitting element 12 is disposed on the light receiving element 11, so that the MOSFET 16 and the MOSFET 17 can be lengthened in the X direction without increasing the size of the entire optical coupling device 4. This makes it possible to increase the size of the switching element and increase the high frequency current RF flowing in the optical coupling device 4. The configuration, operation, and effect of the embodiment other than those described above are the same as those of the first embodiment.

Comparative Example

Next, a comparative example will be described below.

Figure 7A:
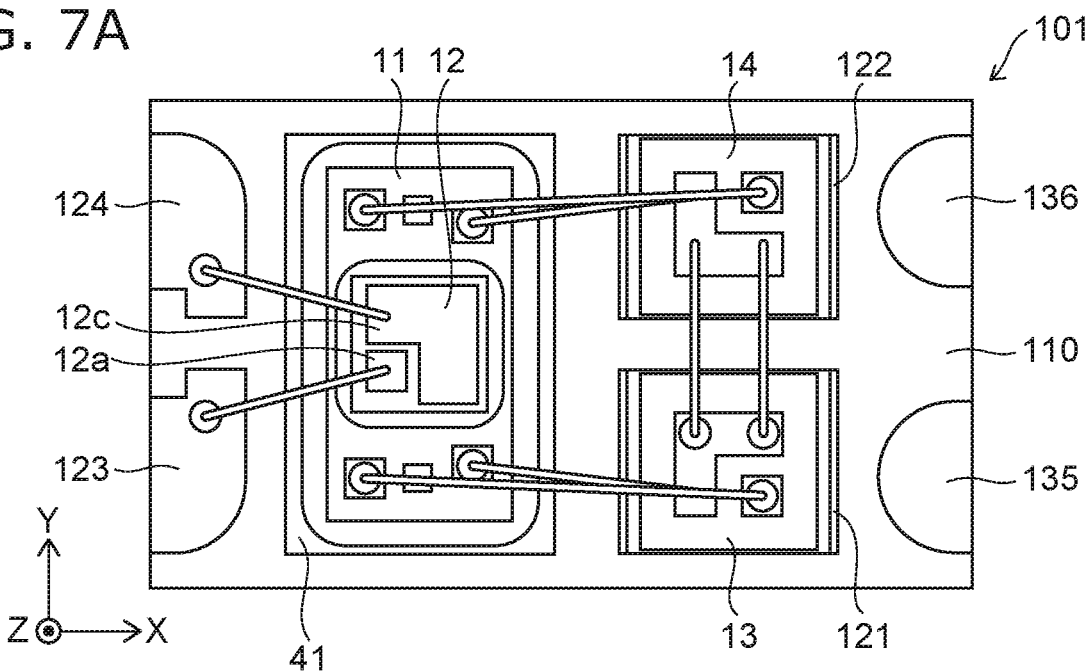
FIGS. 7A to 7C are three-directional views showing an optical device according to a comparative example.
Figure 7B:
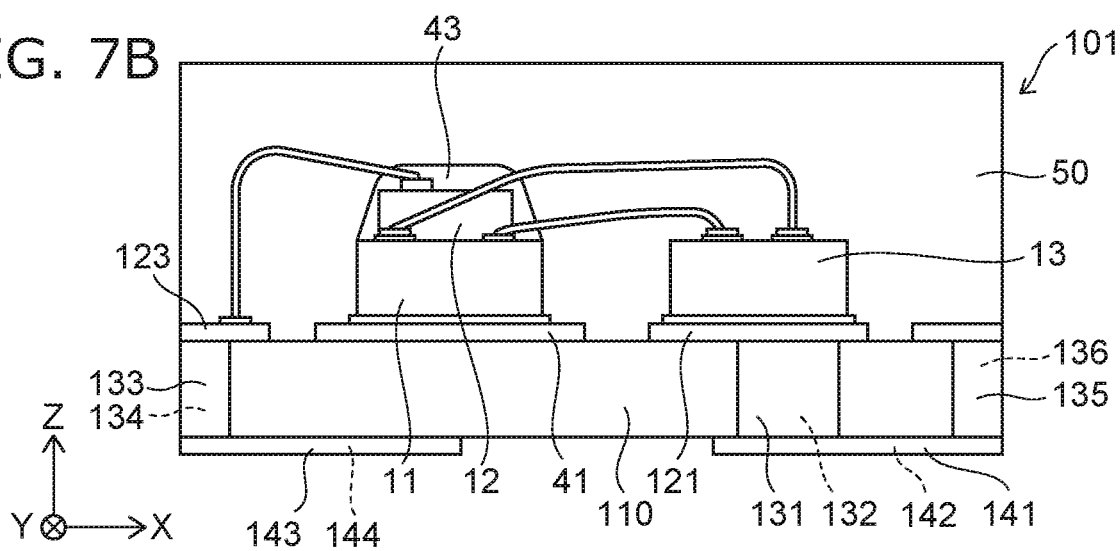
Figure 7C:
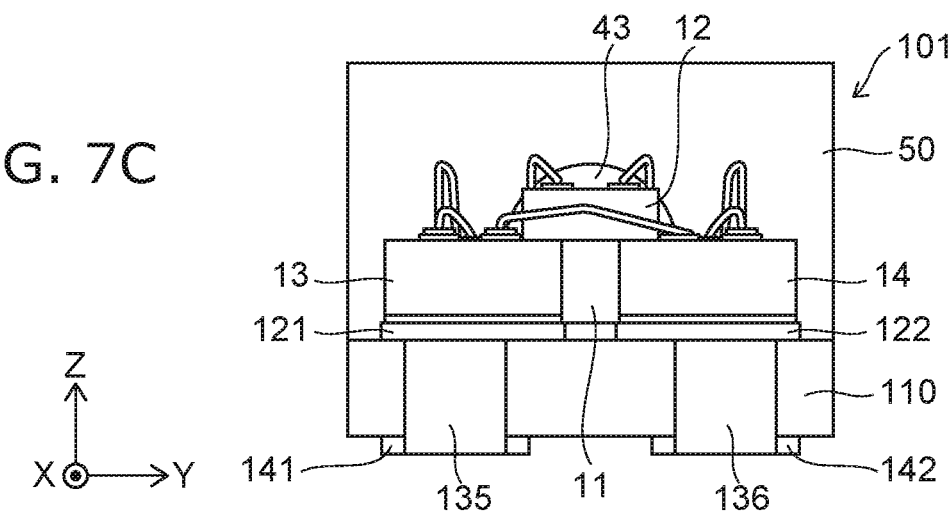

FIGS. 7A to 7C are three-directional views showing an optical coupling device according to the comparative example.

As shown in FIGS. 7A to 7C, in the optical coupling device 101 according to the comparative example, an insulating substrate 110 is provided, and the light receiving element 11, the light emitting element 12, and the MOSFET 13 and 14 or the like are provided on the insulating substrate 110. The insulating substrate 110 is, for example, a glass epoxy substrate.

Upper surface electrodes 121 to 124 are provided on the upper surface of the insulating substrate 110, and embedded conductors 131 to 136 that pierce the insulating substrate 110 in the Z direction are provided inside the insulating substrate 110. Lower surface electrodes 141 to 144 are provided on the lower surface of the insulating substrate 110. The metal plate 41 bonded to the lower portion of the light receiving element 11 is not connected to any of the lower surface electrodes and is in an electrically floating state. The metal plate 41 is formed on the insulating substrate 110.

The lower surface electrode 141 is connected to the drain terminal of the MOSFET 13 via the embedded conductor 131 and the upper surface electrode 121, and the lower surface electrode 142 is connected to the drain terminal of the MOSFET 14 via the embedded conductor 132 and the upper surface electrode 122. The lower surface electrode 143 is connected to the anode terminal 12a of the light emitting element 12 via the embedded conductor 133 and the upper surface electrode 123, and the lower surface electrode 144 is connected to cathode terminal 12c of the light emitting element 12 via the embedded conductor 134 and the upper surface electrode 124. The embedded conductor 135 is connected to the lower surface electrode 141, and the embedded conductor 136 is connected to the lower surface electrode 142. The embedded conductors 133 to 136 are exposed on the side surface of the optical coupling device 101. Other than that, the connection between the terminals on the upper surface of each chip and the electrodes via wires is the same as in FIG. 1.

In the optical coupling device 101 according to the comparative example, the embedded conductors 131 and 132 have a large inductance component, and thus the transmission characteristics of the high frequency current RF is low. In addition, since the embedded conductors 133 to 136 are diced together with the sealing member 50 in the manufacturing process of the optical coupling device 101, the dicing accuracy is low and the dicing blade is greatly worn. Further, since the embedded conductors 133 to 136 are exposed on the dicing surface, peeling easily occurs at the interface between the embedded conductors 133 to 136 and the sealing member 50.

Test Example

Next, a test example showing the effect of the embodiment described above will be described.

Figure 8:
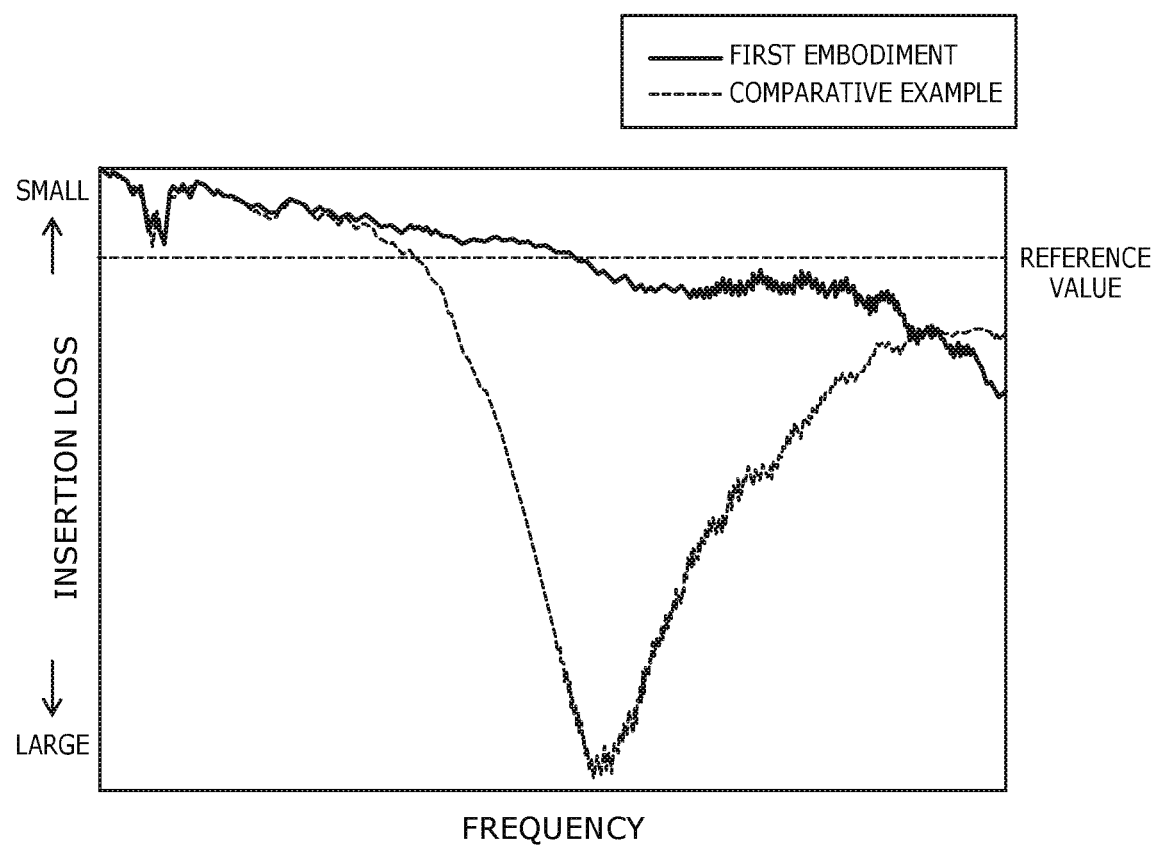
FIG. 8 is a graph view showing high frequency current transmission characteristics, with the horizontal axis representing the frequency of the high frequency current and the vertical axis representing the insertion loss.

FIG. 8 is a graph view showing high frequency current transmission characteristics, with the horizontal axis representing the frequency of the high frequency current and the vertical axis representing the insertion loss.

In the test example, assuming the optical coupling device 1 according to the above-described first embodiment and the optical coupling device 101 according to the comparative example, the frequency of the high frequency current RF is made different, and the insertion loss at each frequency is simulated.

As shown in FIG. 8, in the optical coupling device 101 according to the comparative example, the insertion loss significantly increased in a certain frequency band, but in the optical coupling device 1 according to the first embodiment, such a decrease of transmission characteristics was not observed. Therefore, the frequency band in which the insertion loss is smaller than the reference value was 13.9 GHz or less in the comparative example, whereas it was 21.2 GHz or less in the first embodiment. As described above, in the first embodiment, as compared with the comparative example, good transmission characteristics were obtained for the high frequency current RF in a wider frequency band.

According to the embodiments described above, it is possible to realize an optical coupling device having good high frequency current transmission characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

In each of the above-described embodiments, an example in which the optical coupling device is a photo relay has been described, but the invention is not limited to this. The optical coupling device may be, for example, a photo coupler.

What is claimed is:

1. An optical coupling device, comprising:
   a light receiving element including a first output terminal and a second output terminal;
   a light emitting element provided on the light receiving element;
   a first switching element including a first main terminal connected to the first output terminal, a first control terminal connected to the second output terminal, and a second main terminal;
   a first electrode plate, an upper surface of the first electrode plate being connected to the second main terminal; and
   a sealing member covering the light receiving element, the light emitting element, and the first switching element, a lower surface of the first electrode plate being exposed on a lower surface of the sealing member,
   the lower surface of the first electrode plate and the lower surface of the sealing member forming a same plane.

2. The device according to claim 1, wherein a thickness of the first electrode plate is not more than 0.1 mm.

3. The device according to claim 1, further comprising:
   a first metal plate, a lower surface of the first metal plate being exposed on the lower surface of the sealing member,
   the first switching element being provided on the first metal plate, and
   the first main terminal, the first control terminal, and the second main terminal being provided on an upper surface of the first switching element.

4. The device according to claim 1, further comprising:
   a first insulating film, a lower surface of the first insulating film being exposed on the lower surface of the sealing member,
   the first switching element being provided on the first insulating film, and
   the first main terminal, the first control terminal, and the second main terminal being provided on an upper surface of the first switching element.

5. The device according to claim 1, further comprising:
a second metal plate, an upper surface of the second metal plate being bonded to a lower surface of the light receiving element, a lower surface of the second metal plate being exposed on the lower surface of the sealing member,
the lower surface of the first electrode plate, the lower surface of the second metal plate, and the lower surface of the sealing member forming a same plane.

6. The device according to claim 1, further comprising:
a second insulating film, an upper surface of the second insulating film being bonded to a lower surface of the light receiving element, a lower surface of the second insulating film being exposed on the lower surface of the sealing member,
the lower surface of the first electrode plate, the lower surface of the second insulating film, and the lower surface of the sealing member forming a same plane.

7. The device according to claim 1, further comprising:
a second switching element provided side by side with the first switching element, the second switching element including a third main terminal, a second control terminal and a fourth main terminal, the third main terminal and the second control terminal being provided on an upper surface of the second switching element, the fourth main terminal being provided on a lower surface of the second switching element, the third main terminal being connected to the first output terminal of the light receiving element, the second control terminal being connected to the second output terminal of the light receiving element; and
a second electrode plate, an upper surface of the second electrode plate being connected to the fourth main terminal of the second switching element, a lower surface of the second electrode plate being exposed on the lower surface of the sealing member,
the first main terminal and the first control terminal of the first switching element being provided on an upper surface of the first switching element, the second main terminal of the first switching element being provided on a lower surface of the first switching element, and
the light receiving element being disposed above the first switching element and the second switching element.

8. The device according to claim 1, further comprising:
a third electrode plate connected to an anode terminal of the light emitting element, a lower surface of the third electrode plate being exposed on the lower surface of the sealing member; and
a fourth electrode plate connected to a cathode terminal of the light emitting element, a lower surface of the fourth electrode plate being exposed on the lower surface of the sealing member,
the lower surface of the third electrode plate, the lower surface of the fourth electrode plate, and the lower surface of the sealing member forming a same plane.

9. The device according to claim 1, wherein
a metal member is not exposed on a side surface of the sealing member.

* * * * *